(12) United States Patent
Chen et al.

(10) Patent No.: US 9,541,587 B2
(45) Date of Patent: Jan. 10, 2017

(54) INVERTING APPARATUS FOR AVOIDING MISJUDGEMENT OF MAXIMUM POWER POINT TRACKING OPERATION AND CONTROL METHOD THEREOF

(71) Applicant: FSP TECHNOLOGY INC., Taoyuan (TW)

(72) Inventors: Han-Wei Chen, Taoyuan (TW); Chun-Hao Yu, Taoyuan (TW); Chia-Hua Liu, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 38 days.

(21) Appl. No.: 14/631,846

(22) Filed: Feb. 26, 2015

(65) Prior Publication Data

US 2015/0244285 A1    Aug. 27, 2015

Related U.S. Application Data

(60) Provisional application No. 61/944,587, filed on Feb. 26, 2014.

(30) Foreign Application Priority Data

Feb. 12, 2015 (TW) .............................. 104104727 A

(51) Int. Cl.
*H02M 7/44* (2006.01)
*G01R 21/06* (2006.01)
(Continued)

(52) U.S. Cl.
CPC ................. *G01R 21/06* (2013.01); *G05F 1/67* (2013.01); *H02M 7/48* (2013.01); *H02J 3/385* (2013.01); *Y02E 10/58* (2013.01)

(58) Field of Classification Search
CPC .......... H02M 7/44; H02M 3/04; H02M 3/158; H02M 1/42; H02M 7/537; H02M 1/00; H02M 2001/0003; H02M 2001/0048; H02M 7/48; Y02E 10/58; G01R 21/06; G05F 1/67; G05F 1/66
See application file for complete search history.

(56) References Cited

U.S. PATENT DOCUMENTS

2009/0080226 A1* 3/2009 Fornage .................... G05F 1/67
363/74
2010/0156185 A1* 6/2010 Kim .................... H01M 16/003
307/72

(Continued)

*Primary Examiner* — Gustavo Rosario Benitez
(74) *Attorney, Agent, or Firm* — Jianq Chyun IP Office

(57) ABSTRACT

An inverting apparatus and a control method thereof are provided. The inverting apparatus includes an inverting circuit, a detection circuit, and a control circuit. The inverting circuit converts a DC input power into an AC output power. The detection circuit detects an input voltage and an input current. The control circuit provides a control signal for disturbing the input voltage, such that a voltage value of the input voltage is adjusted to a command voltage represented by the control signal. The control circuit calculates an input power corresponding to each of time points, calculates a power variation between the disturbed power and the undisturbed power, then determines whether the power variation is larger than a predetermined variation, and sets a disturbance voltage according to the determination result, based on an MPPT operation or based on a disturbance direction of the command voltage of the previous time point.

10 Claims, 4 Drawing Sheets

(51) Int. Cl.
*G05F 1/67* (2006.01)
*H02M 7/48* (2007.01)
*H02J 3/38* (2006.01)

(56) References Cited

U.S. PATENT DOCUMENTS

| | | | | |
|---|---|---|---|---|
| 2010/0156186 A1* | 6/2010 | Kim | ............... | H01M 16/003 |
| | | | | 307/72 |
| 2011/0242857 A1* | 10/2011 | Kim | ............... | H02J 3/385 |
| | | | | 363/21.1 |
| 2012/0275196 A1* | 11/2012 | Chapman | ............... | H02J 3/383 |
| | | | | 363/17 |
| 2013/0016536 A1* | 1/2013 | Ehlmann | ............... | H02J 3/385 |
| | | | | 363/34 |
| 2013/0027997 A1* | 1/2013 | Tan | ............... | G05F 1/67 |
| | | | | 363/95 |
| 2013/0127435 A1* | 5/2013 | Chen | ............... | G05F 1/67 |
| | | | | 323/304 |
| 2013/0155739 A1* | 6/2013 | Itako | ............... | G05F 1/67 |
| | | | | 363/95 |
| 2014/0103894 A1* | 4/2014 | McJimsey | ............... | G05F 1/67 |
| | | | | 323/282 |
| 2015/0244286 A1* | 8/2015 | Chen | ............... | G05F 1/67 |
| | | | | 363/95 |

* cited by examiner

INVERTING APPARATUS FOR AVOIDING MISJUDGEMENT OF MAXIMUM POWER POINT TRACKING OPERATION AND CONTROL METHOD THEREOF

CROSS-REFERENCE TO RELATED APPLICATION

This application claims the priority benefits of U.S. provisional application Ser. No. 61/944,587, filed on Feb. 26, 2014 and Taiwan application serial no. 104104727, filed on Feb. 12, 2015. The entirety of each of the above-mentioned patent applications is hereby incorporated by reference herein and made a part of this specification.

BACKGROUND

Technical Field

The invention relates to a power conversion technique, and particularly relates to an inverting apparatus and a control method thereof.

Related Art

In order to improve a whole conversion efficiency of an inverting apparatus, in the control of the inverting apparatus, a control method of a maximum power point tracking (MPPT) operation is generally used to stably maintain an input power of the inverting apparatus to a maximum power point.

In detail, in the general MPPT operation, a control circuit of the inverting apparatus consecutively samples an input power of a current time point, and compares the sampled input power with the input power of a previous time point, so as to determine whether to increase or decrease an input voltage according to a variation of the input power, and through repetitive disturbance and comparison, the input power may approach the maximum power point.

However, in the existing MPPT operation, if the input power sampled by the control circuit is shifted due to an influence of a system noise or an abnormal operation of the control circuit, when the aforementioned MPPT operation is used to track the maximum power point, a tracking error is probably occurred due to misjudgement caused by the above influence.

SUMMARY

The invention is directed to an inverting apparatus and a control method thereof, by which misjudgement of a maximum power point tracking (MPPT) operation caused by sampling an input power interfered by a system noise is avoided.

The invention provides an inverting apparatus includes an inverting circuit, a detection circuit, and a control circuit. The inverting circuit receives a direct current (DC) input power and converts the DC input power into an alternating current (AC) output power. The detection circuit detects an input voltage and an input current of the DC input power under a plurality of time points. The control circuit is coupled to the inverting circuit and the detection circuit, and provides a control signal for controlling the inverting circuit to disturb the input voltage, so as to adjust a voltage value of the input voltage to a command voltage represented by the control signal. The control circuit calculates an input power corresponding to each of the time points according to the input voltage and the input current, and calculates a power variation between the disturbed input power and the undisturbed input power. The control circuit determines whether the power variation is greater than a predetermined variation, and sets a disturbance quantity according to a determination result based on a maximum power point tracking (MPPT) operation or sets the disturbance quantity according to a disturbance direction of the command voltage of the previous time point.

In an embodiment of the invention, when the control circuit determines that the power variation is greater than the predetermined variation, the disturbance quantity is set based on the MPPT operation, where the MPPT operation is to compare the disturbed input power and the undisturbed input power, so that the input power approaches a maximum input power. When the control circuit determines that the power variation is smaller than or equal to the predetermined variation, the disturbance quantity of the current time point is set according to the disturbance direction of the command voltage of the previous time point, such that the command voltage is increased or decreased along the disturbance direction of the command voltage of the previous time point.

In an embodiment of the invention, the control circuit calculates a difference between the input power of the current time point and a reference power to serve as the power variation, where the control circuit further determines whether to update the reference power to the current input power according to the comparison result between the power variation and the predetermined variation.

In an embodiment of the invention, when the control circuit determines that the power variation is greater than the predetermined variation, the control circuit updates the reference power to the current input power, and when the control circuit determines that the power variation is smaller than or equal to the predetermined variation, the control circuit maintains a setting value of the original reference power.

In an embodiment of the invention, when the control circuit determines that the power variation is greater than the predetermined variation, the control circuit further determines whether the input power of the current time point is greater than the reference power, and provides the disturbance quantity complied with the disturbance direction under the time point corresponding to the reference power when the input power of the current time point is greater than the reference power, and provides the disturbance quantity opposite to the disturbance direction under the time point corresponding to the reference power when the input power of the current time point is smaller than or equal to the reference power.

In an embodiment of the invention, when the control circuit determines that the power variation is smaller than or equal to the predetermined variation, the control circuit provides the disturbance quantity complied with the disturbance direction under the time point corresponding to the reference power.

The invention provides a control method of an inverting apparatus, which is adapted to track a maximum input power of a DC input power received by the inverting apparatus. The method includes following steps. The DC input power is received. An input voltage and an input current of the DC input power under a plurality of time points are detected. An input power corresponding to each of the time points is calculated according to the input voltage and the input current. A control signal is provided to disturb the input voltage, so as to adjust a voltage value of the input voltage to a command voltage represented by the control signal. A power variation between the disturbed input power and the undisturbed input power is calculated. It is determines whether the power variation is greater than a predetermined variation, and a disturbance quantity is set according to a determination result based on a maximum power point tracking (MPPT) operation or the disturbance quantity is set according to a disturbance direction of the command voltage of the previous time point.

In an embodiment of the invention, the step of setting the disturbance quantity according to the determination result based on the MPPT operation or setting the disturbance quantity according to the disturbance direction of the command voltage of the previous time point includes following steps. When the power variation is greater than the predetermined variation, the disturbance quantity is set based on the MPPT operation, where the MPPT operation is to compare the disturbed input power and the undisturbed input power, so that the input power approaches the maximum input power. When the power variation is smaller than or equal to the predetermined variation, the disturbance quantity of the current time point is set according to the disturbance direction of the command voltage of the previous time point, such that the command voltage is increased or decreased along the disturbance direction of the command voltage of the previous time point.

In an embodiment of the invention, the step of calculating the power variation between the disturbed input power and the undisturbed input power includes following steps. A difference between the input power of the current time point and a reference power is calculated to serve as the power variation. It is determined whether to update the reference power to the current input power according to the comparison result between the power variation and the predetermined variation.

In an embodiment of the invention, the step of determining whether to update the reference power to the current input power according to the comparison result between the power variation and the predetermined variation includes following steps. When the power variation is greater than the predetermined variation, the reference power is updated to the current input power, and when the power variation is smaller than or equal to the predetermined variation, a setting value of the original reference power is maintained.

In an embodiment of the invention, the step of setting the disturbance quantity based on the MPPT operation, so that the input power approaches the maximum input power includes following steps. It is determined whether the input power of the current time point is greater than the reference power. When the input power of the current time point is greater than the reference power, the disturbance quantity complied with the disturbance direction under the time point corresponding to the reference power is provided. When the input power of the current time point is smaller than or equal to the reference power, the disturbance quantity opposite to the disturbance direction under the time point corresponding to the reference power is provided.

In an embodiment of the invention, the step of setting the disturbance quantity of the current time point according to the disturbance direction of the previous time point, such that the command voltage is increased or decreased along the disturbance direction of the previous time point includes providing the disturbance quantity complied with the disturbance direction under the time point corresponding to the reference power.

According to the above descriptions, the embodiments of the invention provide the inverting apparatus and the control method thereof, in which by determining whether the power variation between the disturbed input power and the undisturbed input power is greater than the predetermined variation, an error of the MPPT operation occurred due to shift of the input power caused by sampling a system noise is avoided, so as to improve operation stability of the whole inverting apparatus.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
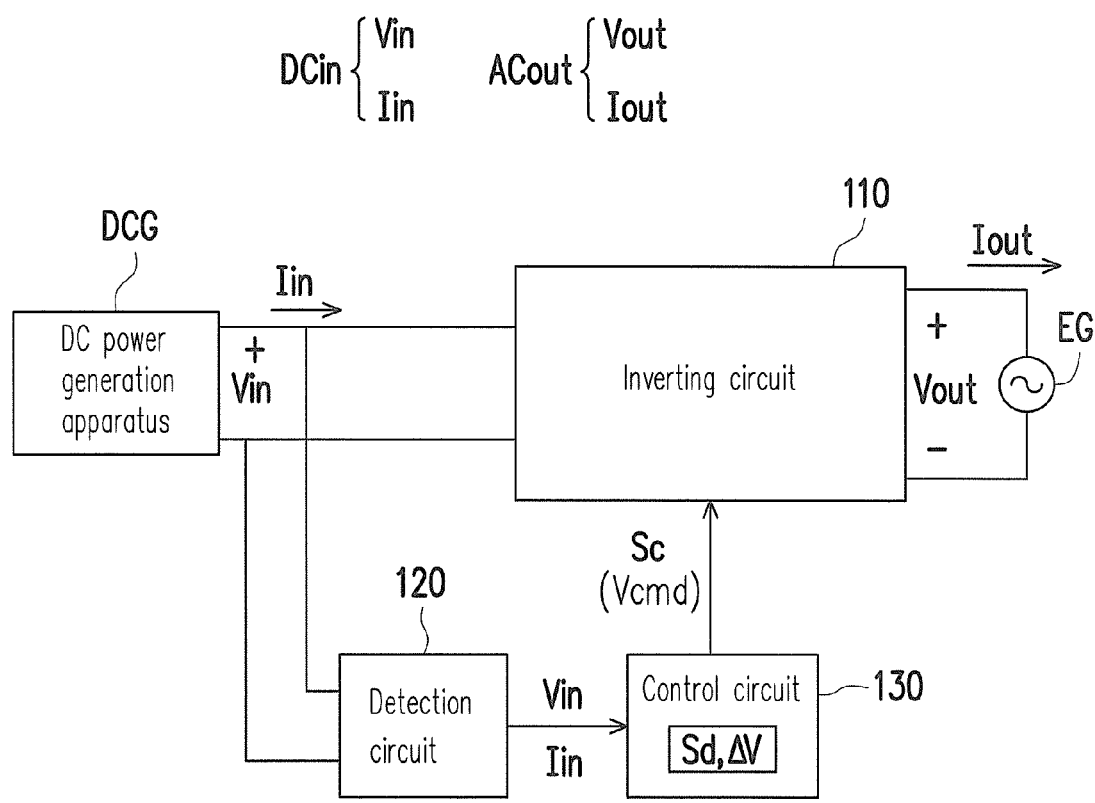
FIG. 1 is a schematic diagram of an inverting apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of an inverting apparatus according to an embodiment of the invention. Referring to FIG. 1, the inverting apparatus 100 of the present embodiment is adapted to an alternating current (AC) power system. In the AC power system, the inverting apparatus 100 receives a direct current (DC) input power DCin (including an input voltage Vin and an input current Iin of the DC type) from a front end DC power generating apparatus DCG, and generates an AC output power ACout (including an output voltage Vout and an output current Iout of the AC type) for providing to a post end electricity grid EG. The DC power generating apparatus DCG is, for example, a photovoltaic module, a wind power generation module, a water power generation module or other types of renewable energy power generation module, which is not limited by the invention.

In the present embodiment, the inverting apparatus 100 includes an inverting circuit 110, a detection circuit 120, and a control circuit 130. The inverting circuit 110 receives the DC input power DCin and converts the DC input power DCin into the AC output power ACout. A circuit configuration of the inverting apparatus 110 is, for example, a half-bridge asymmetric type, half-bridge symmetric type, a full-bridge type or other feasible inverting circuit configurations, which is not limited by the invention.

The detection circuit 120 is coupled to an input terminal of the inverting circuit 110 for detecting the input voltage Vin and the input current Iin of the DC input power DCin under a plurality of time points, and outputs information of the detected input voltage Vin and the input current Iin to the control circuit 130 to serve as a control reference.

The control circuit 130 is coupled to the inverting circuit 110 and the detection circuit 120. The control circuit 130 is used for controlling the power conversion of the inverting circuit 110 and a magnitude of the input voltage Vin of the DC input power DCin, such that a usage rate of the front end DC power generation apparatus DCG is maintained to a certain degree. For example, the control circuit 130 can generate a control signal Sc to control the DC-to-AC conversion of the inverting circuit 110, where the control signal Sc corresponds to a command voltage Vcmd, and the inverting circuit 110 adjusts a level of the input voltage Vin to the command voltage Vcmd represented by the control signal Sc in response to the control signal Sc. The control signal Sc is, for example, a pulse width modulation (PWM) signal used for controlling a switching period of the inverting circuit 110, though the invention is not limited thereto.

On the other hand, the control circuit 130 further provides a disturbance signal Sd to adjust/disturb the generated control signal Sc, so as to adjust a voltage value of the input voltage Vin to the command voltage Vcmd represented by the control signal Sc. In the present embodiment, the control circuit 130 calculates an input power corresponding to each of the time points according to the input voltage Vin and the input current Iin, and calculates a power variation between the disturbed input power and the undisturbed input power (i.e., the power variation between the input powers of different time points), and determines whether the power variation is greater than a predetermined variation. According to the determination result, the control circuit 130 correspondingly adjusts the generated control signals Sc, and the inverting circuit 110 adjusts the magnitude of the input voltage Vin in response to the control signal Sc, such that the input power can be maintained to be close to a maximum power point.

In detail, in the present embodiment, when the power variation is greater than the predetermined variation, the control circuit 130 determines the current power variation to be a valid power variation (i.e., the power variation may reflect a power difference that is actually caused by a variation of the input voltage Vin, and is not caused by a system noise), so that the control circuit 130 sets a disturbance quantity ΔV based on a maximum power point tracking (MPPT) operation, and accordingly outputs the corresponding control signal Sc to adjust the input voltage Vin, such that the output power of the front end DC power generation apparatus DCG may approach the maximum power point.

Conversely, when the power variation is smaller than or equal to the predetermined variation, the control circuit 130 determines that the current power variation is influenced by the system noise or is caused by an abnormal operation of the control circuit, and the control circuit 130 does not perform the MPPT operation according to the current power variation, but sets the disturbance quantity ΔV according to a disturbance direction of a command voltage Vcmd' of the previous time point, and accordingly outputs the corresponding control signal Sc to adjust the input voltage Vin, so as to avoid a control error/instability caused by the aforementioned influence.

Figure 2:
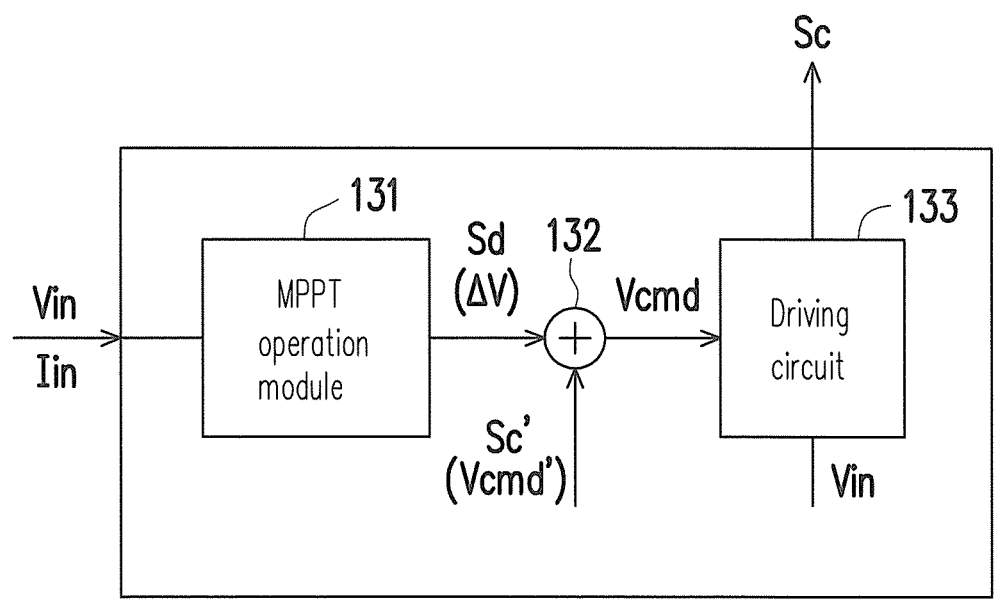
FIG. 2 is a schematic diagram of a control circuit according to an embodiment of the invention.

A detailed system structure of the control circuit 130 is shown in FIG. 2. Referring to FIG. 2, the control circuit 130 may include an MPPT operation module 131, an adder 132 and a driving circuit 133.

It is assumed that in case that the power variation of the input power is greater than the predetermined variation, the control circuit 130 may execute the MPPT operation. In the MPPT operation, the MPPT operation module 131 of the control circuit 130 calculates the input power according to the input voltage Vin and the input current Iin, and adjusts the disturbance quantity ΔV by comparing the disturbed input power and undisturbed input power, so as to generate the corresponding disturbance signal Sd. For example, if the input power of the current time point is greater than the input power of the previous time point, the disturbance signal Sd provided by the MPPT operation module 131 is the disturbance quantity ΔV the same to the disturbance direction under the previous time point (which is represented by a positive disturbance quantity +ΔV), and if the input power of the current time point is smaller than or equal to the input power of the previous time point, the disturbance signal Sd provided by the MPPT operation module 131 is the disturbance quantity ΔV opposite to the disturbance direction under the previous time point (which is represented by a negative disturbance quantity −ΔV).

Then, the adder 132 adds the disturbance signal Sd with the control signal Sc' of the previous time point (representing the command voltage Vcmd'/input voltage Vin' of the previous time point) to generate the corresponding command voltage Vcmd for providing to the driving circuit 133, i.e., the command voltage Vcmd generated by the adder 132 is actually equal to a sum of the disturbance quantity ΔV and the command voltage Vcmd' of the previous time point (Vcmd=Vcmd'+ΔV or Vcmd=Vcmd'−ΔV). In this way, the driving circuit 133 generates the corresponding control signal Sc to control the operation of the inverting circuit 110 according to the command voltage Vcmd.

On the other hand, it is assumed that in case that the power variation of the input power is smaller than or equal to the predetermined variation, the MPPT operation module 131 generates the corresponding disturbance signal Sd according to the disturbance direction of the command voltage Vcmd' of the previous time point. For example, if the MPPT operation module 131 generates the disturbance signal Sd of the positive disturbance quantity +ΔV at the previous time point, the MPPT operation module 131 continually generates the disturbance signal Sd corresponding to the positive disturbance quantity +ΔV to the adder 132 at the present moment. Conversely, if the MPPT operation module 131 generates the disturbance signal Sd of the negative disturbance quantity −ΔV at the previous time point, the MPPT operation module 131 continually generates the disturbance signal Sd corresponding to the negative disturbance quantity −ΔV to the adder 132 at the present moment. In other words, when the control circuit 130 determines that the power variation of the input power is smaller than or equal to the predetermined variation, the control circuit 130 does not take the power variation between the current input power and the input power of the previous time point as a reference for setting the control signal Sc, but continually superposes the disturbance quantity ΔV along the same disturbance direction.

Besides, in order to avoid an error of the MPPT operation caused by the system noise, the control circuit 130 of the present embodiment sets the current input power as a reference power to serve as a reference for the power variation comparison of a next time point only when the control circuit 130 determines that the power variation of the input power is greater than the predetermined variation. In other words, when the power variation of the input power is smaller than or equal to the predetermined variation, the control circuit 130 does not sets the current input power as the reference power, but maintains a setting value of the original reference power.

Therefore, according to the aforementioned control method, the control circuit 130 can reduce a risk of power tracking error caused by the system noise, so as to improve control stability of the maximum power tracking of the inverting apparatus 100.

Figure 3A:
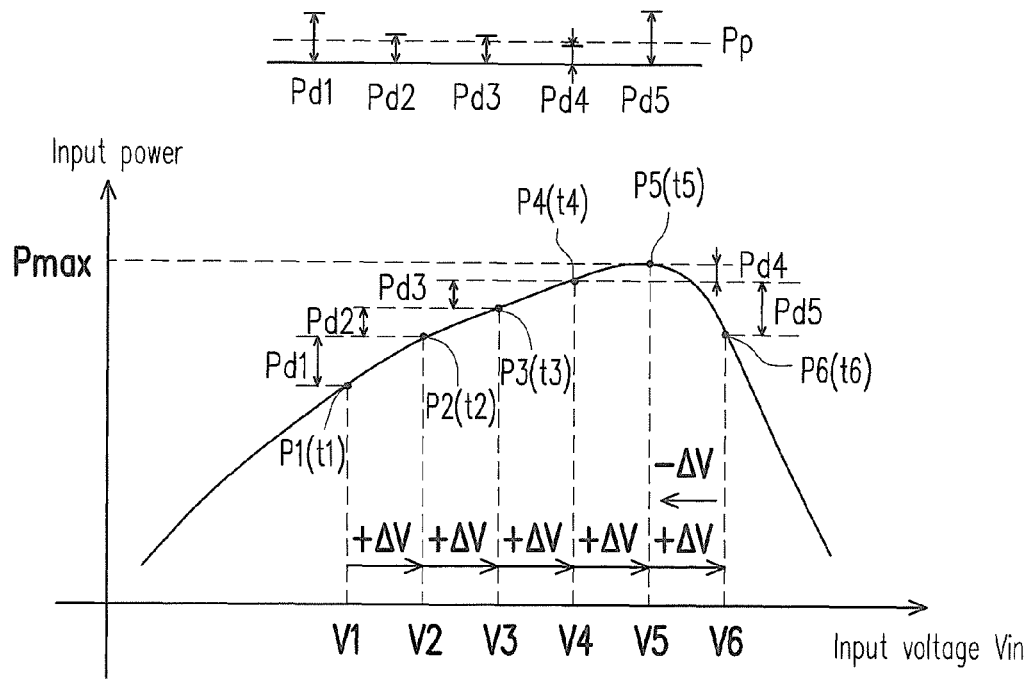
FIG. 3A and FIG. 3B are schematic diagrams of characteristic curves of input power according to different embodiments of the invention.
Figure 3B:
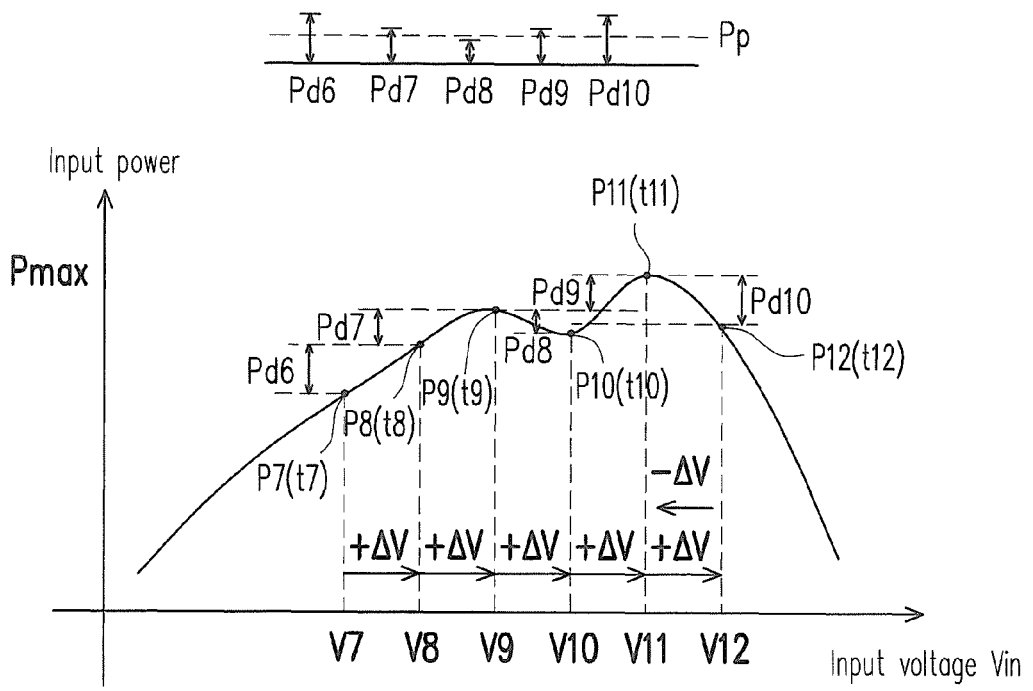

A detailed control flow of the inverting apparatus 100 of the invention is described below with reference of FIG. 3A and FIG. 3B. FIG. 3A is a characteristic curve of the input power-input voltage of the inverting apparatus 100 in a normal state, and FIG. 3B illustrates a relationship of the input power-input voltage of the inverting apparatus 100 influenced by the system noise.

Referring to FIG. 2 and FIG. 3A, at a time point t1, the MPPT operation module 131 detects the input voltage Vin to be a voltage value V1, and calculates the current disturbance quantity $\Delta V$ to be the positive disturbance quantity $+\Delta V$, and generates the corresponding disturbance signal Sd, and the adder 132 generates the corresponding command voltage Vcmd. The driving circuit 133 generates the corresponding control signal Sc after receiving the command voltage Vcmd, and the inverting circuit 110 adjusts the voltage value of the input voltage Vin to the command voltage Vcmd in response to the command voltage Vcmd, i.e., the input voltage Vin=V2=V1+$\Delta V$.

Then, at a time point t2, the MPPT operation module 131 detects that the input voltage Vin is increased from the voltage value V1 to the voltage value V2 (i.e., V1+$\Delta V$). Moreover, under a premise that the input voltage Vin is not inferred by the system noise, the MPPT operation module 131 calculates an input power P2 of the time point t2 according to the characteristic curve of FIG. 3A, and calculates a difference between the input power P2 of the current time point t2 and the reference power (which is an input power P1 of the time point t1) to serve as a power variation Pd1. Then, the MPPT operation module 131 further determines whether the power variation Pd1 is greater than a predetermined variation Pp.

In the present embodiment, the MPPT operation module 131 determines that the power variation Pd1 is greater than the predetermined variation Pp, and the MPPT operation module 131 further determines whether the input power P2 of the time point t2 is greater than the reference power (i.e., the input power P1). Since the current input power P2 is greater than the input power P1, the MPPT operation module 131 generates the disturbance signal Sd corresponding to the positive disturbance quantity $+\Delta V$, and the inverting circuit 110 adjusts the voltage value of the input voltage Vin to the command voltage Vcmd in response to the command voltage Vcmd, i.e., the input voltage Vin=V3=V2+$\Delta V$.

Moreover, in case that the MPPT operation module determines the power variation Pd1 to be greater than the predetermined variation Pp, the MPPT operation module 131 updates the reference power to the current input power P2 to serve as a reference for calculating the power variation of the next time point t3.

Similarly, at the time points t3 and t4, the MPPT module 131 updates the current reference power based on the above operations and calculates the power variations Pd2 and Pd3, and determines that the power variations Pd2 and Pd3 are greater than the predetermined variation Pp, such that the driving circuit 133 sequentially generates the control signals Sc corresponding to a voltage value V4 (i.e., V3+$\Delta V$) and a voltage value V5 (i.e., V4+$\Delta V$).

On the other hand, in case that the input power approaches a maximum power point Pmax, a variation rate of the input power is slowed down, for example, during a period from the time point t4 to the time point t5, a power variation Pd4 calculated by the MPPT operation module 131 is smaller than the predetermined variation Pp.

Therefore, at the time point t4, the MPPT operation module 131 continues to provide the disturbance signal Sd corresponding to the positive disturbance quantity $+\Delta V$ according to the disturbance direction of the previous time point t3, and the driving circuit 133 generates the control signal Sc corresponding to a voltage value V6 (i.e., V5+$\Delta V$).

Moreover, since the MPPT operation module 131 determines that the power variation Pd4 is smaller than the predetermined variation Pp at the time point t5, the MPPT operation module 131 does not update the reference power to the current input power P5, but maintains the reference power to the setting value P4 of the reference power of the previous time point t4.

Then, at a time point t6, the input voltage Vin is increased to the voltage value V6 and the input power P5 is decreased to P6. Now, the MPPT operation module 131 calculates a difference between the current input power P6 and the reference power (which is the input power P4 of the time point t4) to serve as a power variation Pd5, and determines that the power variation Pd5 is greater than the predetermined variation Pp.

Therefore, the MPPT operation module 131 further determines whether the input power P6 of the time point t6 is greater than the reference power (i.e., the input power P4). Since the current input power P6 is smaller than the input power P4, the MPPT operation module 131 generates the disturbance signal Sd corresponding to the negative disturbance quantity $-\Delta V$, and the inverting circuit 110 adjusts the voltage value of the input voltage Vin to the command voltage Vcmd in response to the command voltage Vcmd, i.e., the input voltage Vin=V6−$\Delta V$.

According to the above control method, the control circuit 130 generates the corresponding control signals Sc to make the input voltage Vin to gradually approach the voltage value V5 of the maximum power point Pmax from the voltage value V1, and through the MPPT operation, the input voltage Vin is oscillated within a section around the voltage value V5, such that the inverting apparatus 100 can stably operate on the maximum power point Pmax.

Referring to FIG. 2 and FIG. 3B, the present embodiment is substantially the same to the aforementioned embodiment, and a main difference there between is that the inverting apparatus 100 of the present embodiment is interfered by the system noise at a time point t10 to cause reduction of an input power P10.

In detail, at time points t7, t8 and t9, the MPPT operation module 131 updates the current reference power at each of the time points t7-t9 according to the aforementioned operations, and calculates power variations Pd6 and Pd7, and determines that the power variations Pd6 and Pd7 are greater than the predetermined variation Pp, such that the driving circuit 133 sequentially generates the control signals Sc corresponding to a voltage value V8 (i.e., V7+$\Delta V$) and a voltage value V9 (i.e., V8+$\Delta V$), and the input voltage Vin is gradually increased from a voltage value V7 to a voltage value V9.

Then, at the time point t10, since the detection circuit 120 is interfered by the system noise, the current input power calculated by the MPPT operation module 131 is decreased from P9 to P10, and a power variation Pd8 thereof is smaller than the predetermined variation Pp.

Therefore, at the time point P10, the MPPT operation module 131 does not provide the negative disturbance quantity $-\Delta V$ due to that the current input power P10 is lower than the input power P9 of the previous time point t9, but continues to provide the disturbance signal Sd corresponding to the positive disturbance quantity $+\Delta V$ according to a disturbance direction of the command voltage Vcmd (=V9) of the previous time point t9, such that the driving circuit 133 generates the control signal Sc corresponding to a voltage value V11 (i.e., V10+ΔV).

Moreover, since the MPPT operation module 131 determines that the power variation Pd8 is smaller than the predetermined variation Pp at the time point t10, the MPPT operation module 131 does not update the reference power to the current input power P10, but maintains the reference power to the setting value P9 of the reference power of the previous time point t9. Operations performed at the follow up time points t11 and t12 may refer to the related descriptions of the aforementioned embodiment, and details thereof are not repeated.

According to the above descriptions, it is known that under the control method of the present invention, the shifted input power caused by the system noise is not used as a determination reference of the MPPT operation, such that the operation stability of the whole inverting apparatus 100 is effectively improved.

Figure 4:
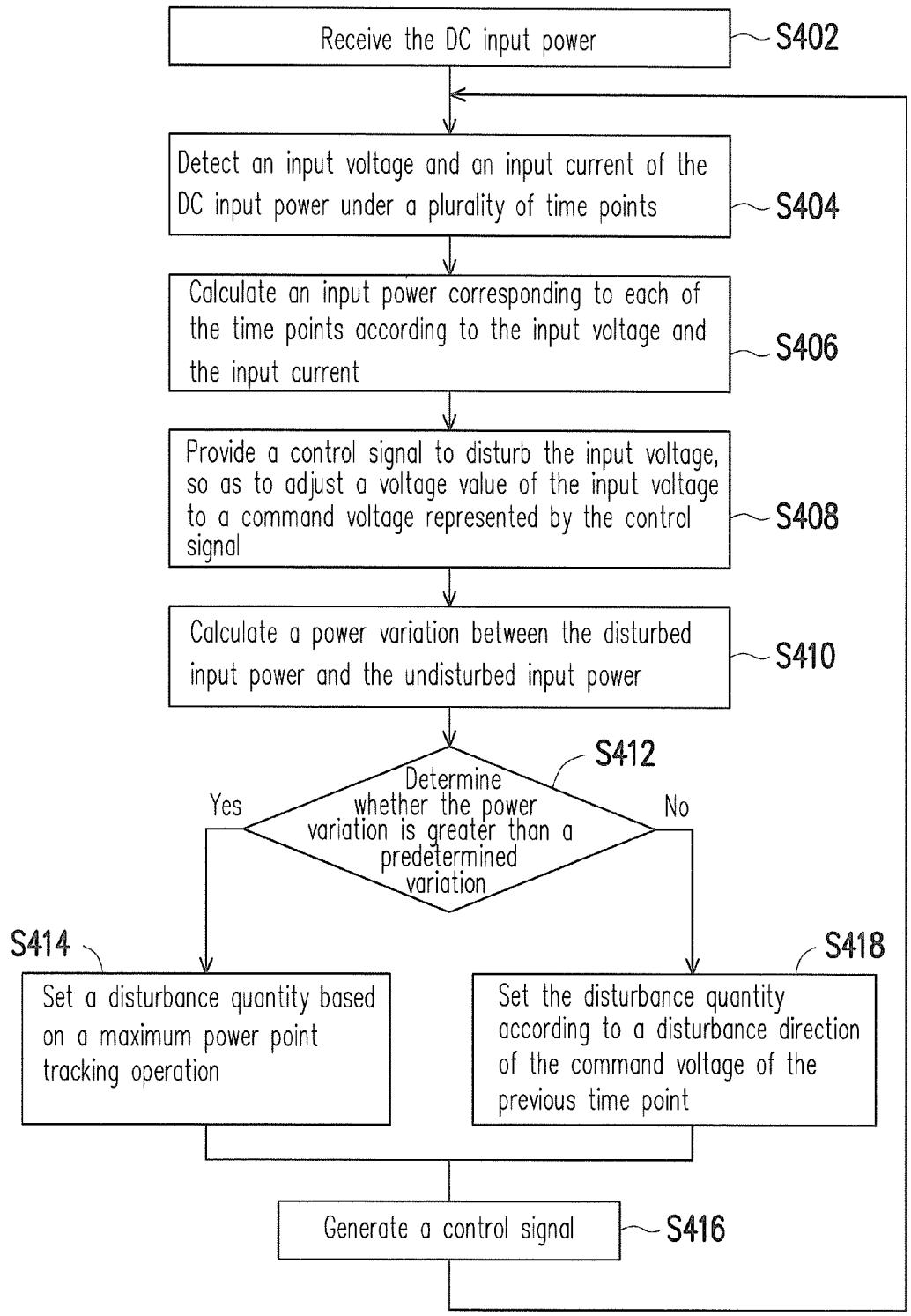
FIG. 4 is a flowchart illustrating a control method of an inverting apparatus according to an embodiment of the invention.

FIG. 4 is a flowchart illustrating a control method of an inverting apparatus according to an embodiment of the invention. The control method of the inverting apparatus of the present embodiment can be applied to the inverting apparatus 100 of the embodiment of FIG. 1 and/or the control circuit 130 of FIG. 2, though the invention is not limited thereto. In the control method of the invention, first, an inverting circuit (for example, the inverting circuit 110) receives the DC input power DCin (step S402), and a detection circuit (for example, the detection circuit 120) detects the input voltage Vin and the input current Iin of the DC input power DCin under a plurality of time points (step S404). Then, a control circuit (for example, the control circuit 130) calculates the input power corresponding to each of the time points according to the input voltage Vin and the input current Iin (step S406), and provides the control signal Sc to disturb the input voltage Vin, so as to adjust a voltage value of the input voltage Vin to the command voltage Vcmd represented by the control signal Sc (step S408). Thereafter, the control circuit calculates a power variation between the disturbed input power and the undisturbed input power (step S410), and determines whether the power variation is greater than a predetermined variation (step S412).

If the determination result of the step S412 is affirmative, the control circuit sets the disturbance quantity ΔV based on the MPPT operation (step S414), and accordingly generates the corresponding control signal Sc (step S416). Conversely, if the determination result of the step S412 is negative, the control circuit sets the disturbance quantity according to a disturbance direction of the previous time point (step S418), and accordingly generates the corresponding control signal (step S416). In this way, the input power of the inverting apparatus 100 is substantially maintained to be around the maximum power point.

Since those skilled in the art can learn enough instructions and recommendations of the control method of the embodiment of FIG. 4 from the descriptions of the embodiments of FIG. 1 to FIG. 3B, detailed description thereof is not repeated.

In summary, the embodiments of the invention provide the inverting apparatus and the control method thereof, in which by determining whether the power variation between the disturbed input power and the undisturbed input power is greater than the predetermined variation, an error of the MPPT operation occurred due to shift of the input power caused by sampling the system noise is avoided, so as to improve operation stability of the whole inverting apparatus.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. An inverting apparatus, comprising:
an inverting circuit, receiving a direct current (DC) input power, and converting the DC input power into an alternating current (AC) output power;
a detection circuit, detecting an input voltage and an input current of the DC input power under a plurality of time points; and
a control circuit, coupled to the inverting circuit and the detection circuit, and providing a control signal for controlling the inverting circuit to disturb the input voltage, so as to adjust a voltage value of the input voltage to a command voltage represented by the control signal, wherein the control signal corresponds to the command voltage,
wherein the control circuit calculates an input power corresponding to each of the time points according to the input voltage and the input current, calculates a power variation between a disturbed input power and an undisturbed input power,
when the power variation is determined to be greater than a predetermined variation, the power variation reflects a power difference caused by a variation of the input voltage, the control circuit determines the power variation to be a valid power variation, and a disturbance quantity is set based on a maximum power point tracking operation, wherein the maximum power point tracking operation is to compare the disturbed input power and the undisturbed input power, so that the input power approaches a maximum input power, and
when the power variation is determined to be smaller than or equal to the predetermined variation, the power variation is another power difference caused by system noise, the control circuit determines the power variation to be an invalid power variation and does not perform the maximum power point tracking operation according to the power variation, and the disturbance quantity of a current time point is set according to a disturbance direction of the command voltage of a previous time point, such that the command voltage is increased or decreased along the disturbance direction of the command voltage of the previous time point.

2. The inverting apparatus as claimed in claim 1, wherein the control circuit calculates a difference between the input power of the current time point and a reference power to serve as the power variation, wherein the reference power is the input power of the previous time point, wherein the control circuit further determines whether to update the reference power to a current input power according to the comparison result between the power variation and the predetermined variation.

3. The inverting apparatus as claimed in claim 2, wherein when the control circuit determines that the power variation is greater than the predetermined variation, the control circuit updates the reference power to the current input power, and when the control circuit determines that the power variation is smaller than or equal to the predetermined variation, the control circuit maintains a setting value of the original reference power.

4. The inverting apparatus as claimed in claim 2, wherein when the control circuit determines that the power variation is greater than the predetermined variation, the control circuit further determines whether the input power of the current time point is greater than the reference power, and provides the disturbance quantity complied with the disturbance direction under the time point corresponding to the reference power when the input power of the current time point is greater than the reference power, and provides the disturbance quantity opposite to the disturbance direction under the time point corresponding to the reference power when the input power of the current time point is smaller than or equal to the reference power.

5. The inverting apparatus as claimed in claim 2, wherein when the control circuit determines that the power variation is smaller than or equal to the predetermined variation, the control circuit provides the disturbance quantity complied with the disturbance direction under the time point corresponding to the reference power.

6. A control method of an inverting apparatus, adapted to track a maximum input power of a. DC input power received by the inverting apparatus, the method comprising:
   receiving the DC input power;
   detecting an input voltage and an input current of the DC input power under a plurality of time points;
   calculating an input power corresponding to each of the time points according to the input voltage and the input current;
   providing a control signal to disturb the input voltage, so as to adjust a voltage value of the input voltage to a command voltage represented by the control signal, wherein the control signal corresponds to the command voltage;
   calculating a power variation between a disturbed input power and an undisturbed input power;
   setting a disturbance quantity based on a maximum power point tracking operation when the power variation is greater than a predetermined variation, wherein the maximum power point tracking operation is to compare the disturbed input power and the undisturbed input power, so that the input power approaches a maximum input power, the power variation reflects a power difference caused by a variation of the input voltage, and the control circuit determines the power variation to be a valid power variation; and
   setting the disturbance quantity of a current time point according to a disturbance direction of the command voltage of a previous time point when the power variation is smaller than or equal to the predetermined variation, such that the command voltage is increased or decreased along the disturbance direction of the command voltage of the previous time point, wherein the power variation is another power difference caused by system noise, the control circuit determines the power variation to be an invalid power variation and does not perform the maximum power point tracking operation according to the power variation.

7. The control method of the inverting apparatus as claimed in claim 6, wherein the step of calculating the power variation between the disturbed input power and the undisturbed input power comprises:
   calculating a difference between the input power of the current time point and a reference power to serve as the power variation, wherein the reference power is the input power of the previous time point; and
   determining whether to update the reference power to a current input power according to the comparison result between the power variation and the predetermined variation.

8. The control method of the inverting apparatus as claimed in claim 7, wherein the step of determining whether to update the reference power to the current input power according to the comparison result between the power variation and the predetermined variation comprises:
   updating the reference power to the current input power when the power variation is greater than the predetermined variation; and
   maintaining a setting value of the original reference power when the power variation is smaller than or equal to the predetermined variation.

9. The control method of the inverting apparatus as claimed in claim 7, wherein the step of setting the disturbance quantity based on the maximum power point tracking operation, so that the input power approaches the maximum input power comprises:
   determining whether the input power of the current time point is greater than the reference power;
   providing the disturbance quantity complied with the disturbance direction under the time point corresponding to the reference power when the input power of the current time point is greater than the reference power; and
   providing the disturbance quantity opposite to the disturbance direction under the time point corresponding to the reference power when the input power of the current time point is smaller than or equal to the reference power.

10. The control method of the inverting apparatus as claimed in claim 7, wherein the step of setting the disturbance quantity of the current time point according to the disturbance direction of the previous time point, such that the command voltage is increased or decreased along the disturbance direction of the previous time point comprises:
   providing the disturbance quantity complied with the disturbance direction under the time point corresponding to the reference power.

* * * * *